(12) United States Patent
Pancholy et al.

(10) Patent No.: US 6,862,215 B1
(45) Date of Patent: Mar. 1, 2005

(54) MRAM DATA LINE CONFIGURATION AND METHOD OF OPERATION

(75) Inventors: Ashish Pancholy, Milpitas, CA (US); Jerome S. Wolfman, San Jose, CA (US)

(73) Assignee: Silicon Magnetic Systems, San Jose, CA (US)

( * ) Notice: Subject to any disclaimer, the term of this patent is extended or adjusted under 35 U.S.C. 154(b) by 141 days.

(21) Appl. No.: 10/281,601

(22) Filed: Oct. 28, 2002

(51) Int. Cl.[7] .............................................. G11C 11/15
(52) U.S. Cl. ...................... 365/173; 365/158; 365/104
(58) Field of Search ................................ 365/173, 158, 365/104, 154, 50, 225.5, 171

(56) References Cited

U.S. PATENT DOCUMENTS

| | | | | |
|---|---|---|---|---|
| 5,838,608 A | * | 11/1998 | Zhu et al. ..................... | 365/158 |
| 6,097,625 A | * | 8/2000 | Scheuerlein ................. | 365/171 |
| 6,104,633 A | | 8/2000 | Abraham et al. ............ | 365/171 |
| 6,515,895 B2 | * | 2/2003 | Naji .............................. | 365/171 |
| 6,542,398 B2 | * | 4/2003 | Kang et al. .................... | 365/97 |
| 6,552,928 B1 | * | 4/2003 | Qi et al. ....................... | 365/171 |
| 6,621,730 B1 | * | 9/2003 | Lage ............................ | 365/158 |
| 6,664,579 B2 | * | 12/2003 | Kim et al. .................... | 257/296 |
| 2004/0042264 A1 | * | 3/2004 | Tran et al. .................... | 365/158 |

* cited by examiner

*Primary Examiner*—Richard Elms
*Assistant Examiner*—Dang Nguyen
(74) *Attorney, Agent, or Firm*—Kevin L. Daffer; Mollie E. Lortang

(57) ABSTRACT

A memory array including a conductive line adapted to simultaneously conduct current in at least two distinct directions relative and adjacent to a magnetic junction is provided. In some embodiments, one of the distinct directions may be substantially aligned with an elongated dimension of the magnetic junction, while another of the distinct directions may be substantially aligned with a shortened dimension of the magnetic junction. In yet other embodiments, at least one of the distinct directions may be aligned at an angle between approximately 0 degrees and approximately 90 degrees relative to an elongated dimension of the magnetic junction. In either case, a memory array is provided which includes a contiguous conductive line having a first portion arranged above a magnetic junction of the memory array and a second portion arranged below the magnetic junction. In addition, a method for operating such a magnetic memory array is provided.

20 Claims, 2 Drawing Sheets

| 33 — Applying voltage to a gate of a transistor adapted to enable current flow through a conductive line arranged adjacent to a magnetic cell juenction during a write operation of a magnetic memory device. |

↓

| 35 — Applying voltage across a different transistor adapted to induce current flow from the conductive line through the magnetic junction during a read operation of the device. |

MRAM DATA LINE CONFIGURATION AND METHOD OF OPERATION

BACKGROUND OF THE INVENTION

1. Field of the Invention

This invention relates to magnetic memory arrays and, more particularly, to data line configurations within magnetic memory cells.

2. Description of the Related Art

The following descriptions and examples are given as background information only.

Recently, advancements in the use of magnetoresistive materials have progressed the development of magnetic random access memory (MRAM) devices to function as viable non-volatile memory circuits. In general, MRAM circuits exploit the electromagnetic properties of magnetoresistive materials to set and maintain information stored within individual magnetic memory cell junctions of the circuit. In particular, MRAM circuits utilize magnetization direction to store information within a magnetic junction, and differential resistance measurements to read information from the magnetic junction. Typically, an MRAM circuit includes a plurality of conductive lines with which to generate magnetic fields such that the magnetic directions of one or more magnetic junctions of the MRAM circuit may be set. Consequently, the conductive lines may be referred to as "field-inducing lines," in some embodiments.

Typically, the conductive lines are formed as substantially straight and uniform structures of metal spaced perpendicular to each other within a plane comprising the magnetic cell junction. In other words, the conductive lines may be arranged in series of columns and rows having magnetic junctions interposed at the overlap points of the conductive lines. In this manner, the device may include a plurality of memory cells aligned within an array. In some cases, the conductive lines may be referred to as "bit" and "digit" lines. In such an embodiment, "bit" lines may refer to the conductive lines that are arranged in contact with magnetic junctions and which are used for both write and read operations of the cell. "Digit" lines, on the other hand, may refer to the conductive lines spaced adjacent to the magnetic junctions and used primarily during write operations of the cell.

In general, an individual magnetic junction can be written to by applying current simultaneously along a bit line and a digit line corresponding to the particular magnetic junction. Such an individual magnetic junction may herein be referred to as a selected magnetic junction, or the magnetic junction intentionally targeted for a writing procedure. During the writing procedure, however, the multitude of magnetic junctions arranged along the bit line and the digit line corresponding to the selected junction will also sense current. Such magnetic junctions are herein referred to as half-selected junctions, or disturbed junctions since the magnetic field induced about them is generated from either a bit line or a digit line rather than from both a bit line and a digit line. Even though less current is applied to these disturbed cells, variations within the magnetic junctions may allow the magnetic field induced by the low current to switch the magnetic directions of one or more of the disturbed cells. In this manner, the write selectivity of the array may be reduced. Write selectivity, as used herein, may refer to the relative difference (i.e., current margin) between the amount of current responsible for switching the magnetization of a disturbed cell and the amount of current needed to switch the magnetization of a selected cell. Consequently, a reduction in write selectivity reduces the tolerance of the current used to reliably switch selected cells without switching disturbed cells within an array. In some cases, the tolerance may too small, allowing a false bit to be unintentionally written to one or more of the disturbed cells and in turn, decreasing the reliability of the array.

In addition, the number of memory cells arranged within an array may be limited by the arrangement of the conductive lines spanning across the columns and rows of the array. In general, the voltage required to generate a desired amount of current along a conductive line increases as the length of a conductive line increases, due to the current-resistance (IR) drop along the line. Since it is desirable to limit the overall power requirements of an array and, therefore, the amount of voltage used to operate the array, the conductive lines are generally restricted in length. Consequently, the number of magnetic junctions within an array is limited. Such a restriction limits the number of devices on a chip, thereby limiting the memory capacity of the integrated circuit.

Therefore, it would be advantageous to develop a magnetic memory array with a configuration that reduces the effect of IR drop on the size of a memory array. In particular, it may be advantageous to fabricate a magnetic memory array with a configuration that eliminates IR drop as a limiting factor for the number of memory cells arranged along at least one dimension of an array. Such an array may advantageously increase the density of memory cells, thereby increasing the number of devices on a chip. In addition, it would be advantageous to develop a magnetic memory array with a configuration that increases the write selectivity of a magnetic memory array. More specifically, it would be advantageous to develop a magnetic memory array with a configuration that eliminates the issue of write selectivity.

SUMMARY OF THE INVENTION

The problems outlined above may be in large part addressed by a memory array that includes a conductive line adapted to simultaneously conduct current in at least two distinct directions relative and adjacent to a magnetic junction of the memory array. In some embodiments, one of the distinct directions may be substantially aligned with an easy axis of the magnetic junction, while another of the distinct directions may be substantially aligned with a hard axis of the magnetic junction. In yet other embodiments, at least one of the distinct directions may be aligned at an angle between approximately 0 degrees and approximately 90 degrees relative to an easy axis of the magnetic junction. In some embodiments, the magnetic junction may be one of an array of magnetic junctions. In such a case, the memory array may be adapted to selectively redirect current from a single source line to the conductive line and one or more additional conductive lines arranged within the array. More specifically, the memory array may be adapted to selectively enable current to flow to the conductive line and one or more additional conductive lines aligned along a single row or column of the array comprising the conductive line. In this manner, the conductive line may be arranged adjacent to less than all of the magnetic junctions arranged along a row or column of the array. In some embodiments, the conductive line may be arranged solely adjacent to one magnetic junction. In other embodiments, however, the conductive line may be arranged adjacent to a plurality of magnetic junctions.

In any case, the adaptation of the conductive line to simultaneously conduct current in at least two distinct directions relative and adjacent to a magnetic junction may entail the conductive line to include a first portion arranged above the magnetic junction and a second portion arranged below the magnetic junction. Consequently, in some cases, one of the first and second portions may be aligned with an easy axis of the magnetic junction and the other of the first and second portions may be aligned with a hard axis of the magnetic junction. For example, in some cases, one of the first and second portions may be aligned with an elongated dimension of the magnetic junction and the other of the first and second portions may be aligned with a shortened dimension of the magnetic junction. In this manner, one of the first and second portions may be adapted to conduct current in alignment with an elongated dimension of the magnetic junction and the other of the first and second portions may be adapted to conduct current in alignment with a shortened dimension of the magnetic junction. In yet other embodiments, at least one of the first and second portions may be aligned at an angle between approximately 0 degrees and approximately 90 degrees relative to an easy axis of the magnetic junction. In some cases, the first and the second portions may be aligned substantially parallel to one another. In such an embodiment, two of the distinct directions in which current is conducted in the conductive line may be aligned in substantially opposite directions from each other. In yet other cases, the first and the second portions may not be aligned substantially parallel to one another.

In some cases, the conductive line described herein may be configured to induce a first magnetic field that exclusively changes the overall direction of a plurality of magnetic vectors arranged in an equilibrium state within a magnetic junction of the memory array. More specifically, the conductive line may be adapted such that another conductive line is not needed to switch the magnetic direction of the magnetic junction. Consequently, the memory array may be substantially absent of another conductive line adapted to induce a magnetic field about the magnetic junction. In such a case, the conductive line may serve as a data line of the memory array. Alternatively, the conductive line may serve solely as a select line. In some embodiments, the conductive line may be further configured to induce a second magnetic field that exclusively changes the overall direction of a plurality of magnetic vectors arranged in an equilibrium state within another magnetic junction of the memory array. In such an embodiment, the magnetic junction switched by the first magnetic field and the magnetic junction switched by the second magnetic field may include a differential pair of magnetic memory junctions.

In any embodiment, the memory array may further include a transistor adapted to control current flow through the conductive line during a write operation of the memory array. Consequently, a method for operating a magnetic memory array is also contemplated herein. Such a method may include applying voltage to a gate of a transistor coupled to a conductive line arranged adjacent to a magnetic cell junction of the magnetic memory array during a write operation of the magnetic memory array. More specifically, the method may include enabling current flow from a source line to the conductive line. In some embodiments, applying voltage to the gate of the transistor may further include enabling current flow between the conductive line and a second conductive line of the magnetic memory array. In either case, the memory array described herein may further include an additional and distinct transistor adapted to control current flow from the conductive line through the magnetic junction during a read operation of the memory array.

There may be several advantages to fabricating the memory array described herein. In particular, the arrangement of a field-inducing line adjacent to less than all of the magnetic junctions aligned along a single row or column of a memory array may advantageously allow a larger memory array to be fabricated. More specifically, the arrangement of several conductive lines along a single row or column of an array may negate IR drop as a limiting factor for the number of cells fabricated along one dimension of a memory array. Consequently, a larger memory cell array may be fabricated. In addition, the reliability of magnetic memory arrays may be improved by the configuration of the conductive line described herein. More specifically, the magnetic junctions may be programmed with a single field-inducing line, rather than two field-inducing lines. As a result, write selectivity of cells within an array may be improved, or in some cases, negated, improving the reliability of the array. Furthermore, the overall power requirements of such an array may be lower than an array including a conventional magnetic memory cell since one field-inducing line is used to switch the magnetic direction of a magnetic cell junction rather than two field-inducing lines.

BRIEF DESCRIPTION OF THE DRAWINGS

Other objects and advantages of the invention will become apparent upon reading the following detailed description and upon reference to the accompanying drawings in which.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1:
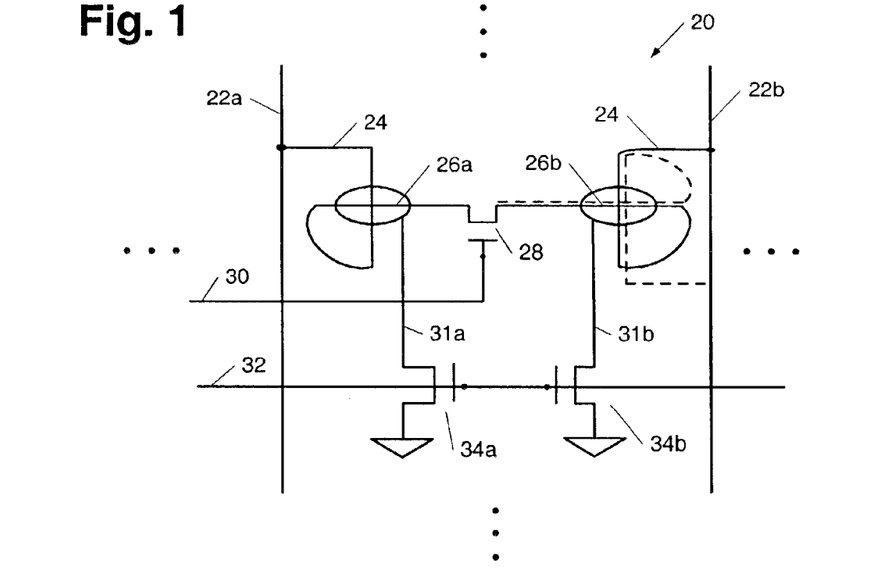
FIG. 1 depicts a partial electrical schematic diagram of a magnetic memory cell array.

Turning to the drawings, exemplary embodiments of magnetic memory cell arrays are provided. In addition, an exemplary embodiment of a method for operating such memory cell arrays is provided. FIG. 1 depicts a partial electrical schematic diagram of memory array 20 including conductive line 24 adapted to simultaneously conduct current in at least two distinct directions relative to magnetic memory cell junctions 26a and 26b. In particular, FIG. 1 illustrates conductive line 24 adapted to simultaneously conduct current along dimensions of magnetic cell junctions 26a and 26b which are substantially perpendicular to each other. In other embodiments, however, conductive line 24 may be adapted to simultaneously conduct current along directions of magnetic cell junctions 26a and/or 26b which are not perpendicular to each other. An embodiment including such a configuration is described in more detail below in reference to FIG. 4. FIG. 1 further depicts transistor 28 which is adapted to control current flow through conductive line 24 from current source line 22a or 22b upon the application of voltage along select line 30. In this manner, conductive line 24 may be adapted to program magnetic cell junctions 26a and 26b upon the application of a voltage to the gate of transistor 28.

In general, information may be stored within a magnetic cell junction as a bit, the state of which is indicated by the direction of magnetization within one magnetic layer of the cell junction relative to another magnetic layer of the cell junction. In some cases, it may be advantageous to orient the magnetization of the two magnetic layers within the magnetic cell junction to either be parallel or antiparallel to each other to maximize the differential resistance from which the bit is determined. "Antiparallel," as used herein, may refer to a direction that is oriented substantially opposite from a reference direction, or in other words, a direction that is oriented approximately 180° from a reference direction. Consequently, "parallel" may refer to a direction that is oriented in a substantially similar direction as a reference direction, or in other words, a direction that is oriented approximately 0° from a reference direction. In general, the internal magnetic field within a magnetic layer is directed along a plurality of individual magnetic vectors, the vector sum of which determines the overall magnetic direction of the layer. In cases in which no external field is applied to the layer, the vector pattern may be referred to as an equilibrium vector state. Since substantially no external energy is required to produce such an equilibrium vector state, the direction represented by the vector sum of the individual magnetic vectors in such a state may be designated as the "easy axis" of magnetization. On the other hand, a "hard axis" of magnetization may be designated as the direction that requires the largest external field to maintain a vector pattern state in between two easy axes of magnetization.

In some equilibrium vector states, the individual magnetic vectors may align naturally along the lateral periphery of the magnetic layer to decrease the demagnetizing energy of the magnetic layer. In this manner, the innate alignment of the magnetic vectors may produce a vector pattern, which approximately follows the shape of the magnetic layer. Consequently, in some embodiments, a magnetic cell junction may be configured to manipulate the logic states of the bit. More specifically, a magnetic cell junction may be configured to have a shape which promotes the orientation of parallel and antiparallel directions within the magnetic layers of the cell junction. For example, in some embodiments, a magnetic cell junction may be fabricated to have an elliptical shape such that the magnetic junction may have an elongated dimension and a shortened dimension. It is noted that although the description of manipulating logic states within magnetic junction provided herein is directed at elliptically shaped magnetic junctions, other shapes known in the MRAM fabrication industry may also or alternatively be used to promote parallel and antiparallel directions within magnetic layers of cell junctions.

Since the innate alignment of magnetic vectors within a layer may, in some embodiments, follow the shape of the layer, the magnetic direction of layers within an elliptically shaped magnetic junction may, in some embodiments, align with the elongated dimension of the cell junction when no external field is applied. In particular, an elliptically shaped magnetic junction may have layers with equilibrium vector states aligned in either direction of the elongated dimension of the magnetic junction. In this manner, elliptically shaped magnetic junctions may induce parallel and antiparallel magnetizations when no external field is applied. Consequently, in some embodiments, the elongated dimension of an elliptically shaped cell junction may be referred to as the easy axis of the junction. In other cases, however, other directions along an elliptically shaped magnetic cell junctions may additionally or alternatively be referred to as easy axes of magnetization, depending the materials used within the junctions and/or the process used to fabricate the junctions as explained in more detail below.

The manner in which the magnetization of cell junctions are switched between equilibrium vector states, however, does include the application of external fields. In particular, an external field is needed to switch the magnetization of a junction between parallel and antiparallel logic states. In general, the strength of the magnetic fields needed to maintain a vector state in a direction other than along the easy axes of the junction varies between the easy axes of the junction. In some cases, maintaining the magnetic vectors in a direction that is substantially perpendicular to the easy axes of the junction may require the largest magnetic field between such axes. Consequently, in some embodiments, the shortened dimension of an elliptically shaped magnetic junction may be referred to as the hard axis of magnetization. Other directions along an elliptically shaped magnetic cell junctions, however, may additionally or alternatively be referred to as hard axes of magnetization, depending on the design specifications of the array.

In some embodiments, characteristics other than the shape of the magnetic junction may contribute to the equilibrium vector state of the junction. For example, in some cases, the direction of the equilibrium vector state of the magnetic junction may be additionally or alternatively dependent on the material composition or the chemical nature of the magnetic layers within the magnetic junction. In other cases, the equilibrium vector state may be additionally or alternatively formed by inducing an external field during the formation or annealing of the magnetic junction. In this manner, an elliptically shaped magnetic junction may be configured to have easy and/or hard axes along directions other than the elongated and shortened dimensions of the magnetic junction. In addition or alternatively, a magnetic junction may be configured to have one or more easy and/or hard axes. In some embodiments, the magnetic layer may not have elongated and shortened dimensions (e.g., a circular-shaped magnetic cell junction). Consequently, the equilibrium vector state of a circular-shaped magnetic junction may not depend on the shape of the cell junction to orient the easy and hard axes of magnetization. In yet other embodiments, a magnetic cell junction may not include easy and hard axes of magnetization.

In some embodiments and as shown in FIG. 1, magnetic cell junctions 26a and 26b may include elliptical shapes having elongated dimensions and shortened dimensions. As stated above, conductive line 24 may be adapted to simultaneously conduct current in at least two distinct directions relative and adjacent to magnetic cell junctions 26a and 26b. In some embodiments, one of the distinct directions may be substantially aligned with an easy axis of the magnetic junctions while another of the distinct directions is substantially aligned with a hard axis of the magnetic junctions. Consequently, in some embodiments, conductive line 24 may have portions aligned with the elongated dimensions of magnetic cell junctions 26a and 26b and portions aligned with the shortened dimensions of magnetic cell junctions 26a and 26b. In some embodiments, portions of conductive line 24 may be additionally or alternatively arranged along other directions of magnetic cell junctions 26a and 26b, depending on the design specifications of the array. For example, portions of conductive line 24 may be additionally or alternatively arranged along other easy and/or hard axes of magnetic cell junctions 26a and 26b. In addition or alternatively, conductive line 24 may have portions aligned along directions other than the easy and hard axes of magnetic cell junctions 26a and 26b. In this manner, the configuration of conductive line 24 may be arranged along any direction of magnetic cell junctions 26a and 26b.

Therefore, although configuration of conductive line 24 is sometimes described in reference to the elongated and shortened dimensions magnetic cell junctions 26a and 26b, the configuration of conductive line 24 is not restricted to such dimensions of the magnetic cell junctions. In fact, in some embodiments, magnetic cell junctions 26a and 26b may not include elongated or shortened dimensions. Consequently, the embodiment depicted in FIG. 1 is not restricted to elliptically shaped magnetic cell junctions. In particular, the magnetic memory array configuration described herein may be incorporated with magnetic cell junctions of any shape and/or size. In addition, although configuration of conductive line 24 is sometimes described in reference to the easy and hard axes magnetic cell junctions 26a and 26b, the configuration of conductive line 24 is not restricted to such directions of the magnetic cell junctions. In fact, in some cases, magnetic cell junctions 26a and 26b may not include easy and hard axes orientations. Consequently, the configuration of conductive line 24 is not restricted to the configuration shown in FIG. 1.

As stated above, magnetic cell junctions 26a and 26b may be used to store data. In this manner, data may be read from and/or written to magnetic cell junctions 26a and 26b. In general, the writing operation of magnetic cell junctions 26a and 26b may be conducted by setting the magnetic direction of magnetic cell junctions 26a and 26b. In particular, magnetic cell junctions 26a and 26b may be written by a magnetic field induced by the application of current along conductive line 24. The reading operation, however, may be conducted by enabling current flow through magnetic cell junctions 26a and/or 26b from conductive line 24 to interconnect lines 31a and/or 31b, respectively. Allowing current to flow through magnetic cell junctions 26a and/or 26b may allow a differential resistance to be determined between the magnetic layers of the junctions such that the logic state of the bit stored in magnetic cell junctions 26a and/or 26b may be read.

Figure 2:
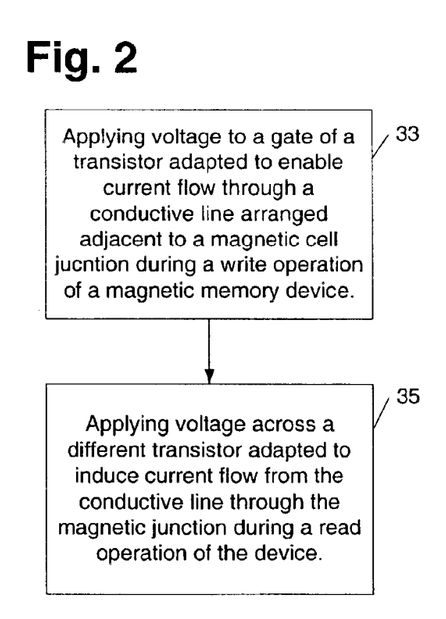
FIG. 2 depicts a flowchart for a method of operation for the magnetic memory cell array depicted in FIG. 1.

A method detailing the operation steps of a memory array is shown FIG. 2. In particular, FIG. 2 illustrates a flow chart depicting write and read operations of a memory array having a configuration as described herein. As shown in FIG. 2, the method may include applying voltage to a gate of a transistor which is adapted to control current flow through a conductive line arranged adjacent to a magnetic cell junction during a write operation of magnetic memory array as shown in step 33. For example, the method of writing to magnetic cell junctions 26a and 26b in FIG. 1 may include applying voltage to the gate of transistor 28 which is adapted to control current flow through conductive line 24 such that a magnetic field may be induced to switch the magnetizations of magnetic cell junctions 26a and 26b. It is noted that step 33 in FIG. 2 is distinct from the operation of conventional magnetic memory arrays. In particular, write operations of conventional magnetic memory arrays do not employ the use of a transistor to switch the magnetic direction of magnetic cell junctions.

As shown in FIG. 1, memory array 20 may include transistor 28 coupled between portions of conductive line 24 respectively arranged adjacent to magnetic cell junctions 26a and 26b. In addition, memory array 20 may include select line 30, which is adapted to induce voltage to the gate of transistor 28 such that current may flow through the portions of conductive line 24 arranged adjacent to magnetic cell junctions 26a and 26b. Such a configuration may be particularly advantageous in embodiments in which magnetic cell junctions 26a and 26b are contained within a single memory cell and, therefore, serve as a differential pair of magnetic cell junctions as shown in FIG. 1. In general, bit values stored in magnetic cell junctions of a differential memory cell may be oriented opposite from each other such that a differential measurement during a read operation of the array may be obtained. Such a differential measurement between the magnetic cell junctions may be used to validate the stored bit values of the magnetic cell junctions. In this manner, measuring the differential resistance between the two junctions may offer a better manner in which to detect the stored data of the memory cell than measuring the resistance of a single junction.

Consequently, in some embodiments, conductive line 24 may be configured such that bits having opposite values may be written to magnetic cell junctions 26a and 26b. More specifically, conductive line 24 may be configured such that magnetic fields of substantially different directions are induced about magnetic cell junctions 26a and 26b. In some embodiments, the magnetic fields may be oriented substantially opposite from one another. In other words, the magnetic fields may be oriented such that are arranged approximately 180° from each other. In other embodiments, however, the magnetic fields may not be substantially opposite from each other. More specifically, in some embodiments, the magnetic fields may be oriented less than approximately 180° relative to each other. In either case, the magnetic fields are preferably oriented such that the magnetization of magnetic cell junctions 26a and 26b may be set in opposite directions. In some cases, such an orientation of magnetic fields may be induced by conductive line 24 having a portion that is aligned along a first dimension of magnetic cell junction 26a and another portion that is aligned along a similar dimension of magnetic cell junction 26b in a substantially opposite direction. For example, conductive line 24 may be configured to conduct current along a first direction of the shortened dimension of magnetic cell junction 26a and along an opposite direction of the shortened dimension of magnetic cell junction 26b as shown in FIG. 1.

In general, a field-inducing line arranged along the shortened dimension of an elliptically shaped magnetic cell junction may induce a magnetic field along the elongated dimension and therefore, in some cases, the easy axis of the cell junction. Consequently, in some cases, conductive line 24 may be configured such that the induced magnetic field favors the direction of the elongated dimension. For example, in some cases, the portions of conductive line 24 aligned with the shortened portions of magnetic cell junctions 26a and 26b may be arranged in contact with the cell junctions, while the portions of conductive line 24 aligned with the elongated portions of magnetic cell junctions 26a and 26b may be spaced away from the cell junctions. Such a configuration of conductive line 24 is described in more detail below in reference to FIG. 3 along with other configuration embodiments. Consequently, conductive line 24 is not restricted to the configuration illustrated in FIG. 1. In particular, conductive line 24 may be configured to induce magnetic fields of any direction around magnetic cell junctions 26a and 26b. In this manner, the directions of magnetic cell junctions 26a and 26b which portions of conductive line 24 are configured to be arranged in opposite directions relative to each other are not restricted to the shortened dimensions of the cell junctions. In particular, the directions of magnetic cell junctions 26a and 26b which portions of conductive line 24 are configured to be arranged in opposite directions relative to each other may be any direction along magnetic cell junctions 26a and 26b, including but not limited to the elongated dimensions of the junctions.

In some embodiments, however, magnetic cell junctions 26a and 26b may be each contained within their own memory cell. Consequently, magnetic cell junctions 26a and 26b may not be included within a differential memory cell, in such an embodiment. Therefore, it may be advantageous for conductive line 24 to be configured to induce magnetic fields having substantially similar directions, in such an embodiment. For example, in some embodiments, conductive line 24 may be configured to conduct current in a substantially similar direction across the shortened dimensions of magnetic cell junctions 26a and 26b. Such a configuration may entail routing conductive line 24 to follow the dotted line in the schematic drawing of FIG. 1 rather than the solid line that includes the configuration described above. It is noted that the dotted line depicted in FIG. 1 is shifted relative to the solid line to distinguish the relative routes of conductive line 24 and, therefore, is not shown coupled to transistor 28. However, such an alternate configuration of conductive line 24 would include the portion above magnetic cell junction 26b to be coupled to transistor 28 such that current could be conducted along the line. In yet other embodiments, conductive line 24 may be rerouted to have the portion corresponding to magnetic cell junction 26a change its course of direction relative to the configuration depicted in FIG. 1. As noted above, the routing of conductive line 24 is not restricted to align with the shortened and elongated dimensions of magnetic cell junctions 26a and 26b and, therefore, the routing of conductive line 24 relative to magnetic cell junctions 26a and 26b in an embodiment in which the conductive line is arranged in a similar manner about the cell junctions may be along any directions of the junctions.

In yet other embodiments, conductive line 24 may be adapted to simultaneously conduct current in at least two distinct directions relative and adjacent to one of magnetic cell junctions 26a and 26b. For example, in some embodiments, conductive line 24 may be adapted to simultaneously conduct current along at least two distinct directions relative to magnetic cell junction 26a, but not along two distinct directions of magnetic cell junction 26b. In such an embodiment, conductive line 24 may, in some cases, be adapted to conduct current along a single dimension of magnetic cell junction 26b. In other cases, however, conductive line 24 may be adapted to conduct current solely about magnetic cell junction 26a. In either case, memory array 20 may, in some cases, include an additional conductive line adapted to conduct current adjacent to magnetic cell junction 26b. Such an additional conductive line may be adapted to conduct current along one or more directions relative and adjacent to magnetic cell junction 26b. In yet other embodiments, memory array 20 may not include an additional conductive line adapted to conduct current along directions relative to magnetic cell junction 26b. It is noted that the configuration of conductive line 24, in other embodiments, may be adapted to conduct current along at least two distinct directions relative and adjacent to magnetic cell junction 26b, but not along two distinct directions of magnetic cell junction 26a. In such an embodiment, the aforementioned reference to the inclusion of an additional conductive line may be arranged adjacent to magnetic cell junction 26a.

In regard to the embodiments in which magnetic cell junctions 26a and 26b are not configured within a single memory cell, transistor 28, in some cases, may not be coupled between the cell junctions, but rather may be coupled between one of magnetic cell junctions 26a and 26b and ground. In this manner, transistor 28 may be adapted to conduct current adjacent to a single magnetic cell junction during a write operation of the array. In some cases, memory array 20 may include a transistor for each magnetic cell junction which are adapted to enable current flow adjacent to the cell junctions during the write operation of the array. It is noted that the inclusion of a transistor for each magnetic cell junction is distinct from the inclusion of transistors 34a and 34b for magnetic cell junctions 26a and 26b as explained in more detail below. In particular, transistors used for the write operation of the array may be used to conduct current adjacent to the magnetic cell junctions. Transistors 34a and 34b, however, may be used for the read operation of the array and therefore, may be used to enable current flow though the magnetic cell junctions.

Returning to FIG. 2, the method of operation of a magnetic memory array described herein may further include step 35 in which voltage is applied to the gate of a transistor which is adapted to control current flow from the conductive line through the magnetic junction during a read operation of the array. For example, the method of reading to magnetic cell junctions 26a and 26b in FIG. 1 may include applying a voltage to the gates of transistors 34a and/or 34b which are adapted to control current flow through magnetic cell junctions 26a and 26b upon the activation of word line 32. In this manner, the memory cell of the magnetic memory array described herein may include at least two distinct transistors; one used for write operations and one or more used for read operations of the array.

In general, the size of memory array 20 may depend on the size of the memory array components and the size of the substrate on which they are formed. Therefore, although FIG. 1 only illustrates two magnetic memory cell junctions, memory array 20 may include any number of rows and columns of magnetic memory cell junctions as indicated by the continuation dots arranged along the periphery of memory array 20. As described above, conductive line 24 may be adapted to conduct current adjacent to one or both of magnetic cell junctions 26a and 26b. In some cases, however, conductive line 24 may be further adapted to conduct current adjacent to other magnetic cell junctions of memory array 20. In particular, conductive line 24 may be further adapted to conduct current adjacent to other magnetic cell junctions that are arranged in alignment with magnetic cell junctions 26a and/or 26b. In this manner, conductive line 24 may be adapted to conduct current adjacent to a plurality of magnetic cell junctions arranged within a row or a column of the array. As such, in some embodiments, conductive line 24 may be configured to conduct current adjacent to one or more cell junctions within a column of memory array 20 rather than a row of memory array 20 as shown in FIG. 1.

Preferably, conductive line 24 may be adapted to conduct current adjacent to less than all of the magnetic cell junctions arranged within a row or a column of memory array 20. In particular, the length of conductive line 24 may be restricted such that the effect of the IR drop along the line is reduced to a level which does not influence the voltage at which to operate memory array 20. More specifically, the length of conductive line 24 may be restricted such that the IR drop of the line does not act as a limiting factor for the number of magnetic junctions arranged along one dimension of memory array 20. In this manner, the size of memory array 20 may not be limited by the IR drop of the conductive lines arranged adjacent to the magnetic cell junctions of a row or column of the array. Consequently, the number of cell junctions within an array described herein may be larger than the number of cell junctions included in conventional arrays.

As shown in FIG. 1, memory array 20 may include current source lines 22a and 22b arranged adjacent to magnetic cell junctions 26a and 26b, respectively. The function of current source lines 22a and 22b may be substantially similar in that they may supply current with which to either write or read data to and from magnetic memory cell junctions 26a and 26b. In particular, the current applied to conductive line 24 during a read operation of memory array 20 may be supplied from current source lines 22a and/or 22b. More specifically, current may be induced through one or both portions of conductive line 24 corresponding to magnetic cell junctions 26a and 26b from current source lines 22a and/or 22b. During a write operation of the array, however, current may be induced from either current source line 22a or current source line 22b. Such a dual source of current may allow current to flow through conductive line 24 in two different directions. In this manner, the current source line 22a may be used to write bit information to magnetic cell junctions 26a and 26b which is opposite from the bit information written from the current supplied from current source line 22b.

In other embodiments, however, current may be provided to the cells from both current source lines 22a and 22b. In particular, in an embodiment in which conductive line is not adapted to conduct current adjacent to both magnetic cell junctions 26a and 26b (i.e., in an embodiment in which transistor 28 is not coupled between magnetic cell junctions 26a and 26b), current may be supplied from current source line 22a and/or current source line 22b such that magnetic cell junctions 26a and/or 26b may be respectively programmed. In either case, current source lines 22a and 22b may be coupled to one or more additional conductive lines arranged along the dimension of memory array 20 which include magnetic cell junctions 26a and 26b, respectively. In this manner, memory array 20 may be adapted to selectively supply current from source lines 22a and/or 22b to conductive line 24 and one or more additional conductive lines arranged within the array.

In any case, the inclusion of current source lines 22a and 22b may allow conductive line 24 to be the only field-inducing line used to write and read data from magnetic cell junctions 26a and/or 26b in some cases. In such an embodiment, conductive line 24 may be referred to as a data line. "Data line" as used herein may refer to a conductive line which is used to both write to and read from a magnetic cell junction. In some embodiments, memory array 20 may be substantially absent of another conductive line adapted to induce a magnetic field about magnetic cell junctions 26a and/or 26b. Consequently, the write selectivity of memory array 20, in such an embodiment, may be advantageously negated since magnetic cell junctions 26a and 26b may be programmed with a single field-inducing line rather than two field-inducing lines. As a result, the reliability of the array described herein may be greater than an array having a conventional configuration. Furthermore, less current will be used through an array having less conductive lines with which to switch the magnetic junctions of the array. Accordingly, the overall power requirements of such an array may be lower than an array including a conventional magnetic memory cell.

In addition, an array having only one field-inducing line with which to change the magnetization of a cell junction may allow the junction to be programmed in a different manner than by conventional techniques which use two field-inducing lines with which to write to a magnetic cell junction. In particular, a conventional array uses a digit line to induce a magnetic field with which to alter the magnetic vector pattern of the junction from its equilibrium state before switching the magnetization of the junction with a magnetic field induced by both the digit line and a corresponding bit line. An array which only has one field-inducing line arranged adjacent to a junction as described herein, however, may be adapted to induce a magnetic field that exclusively changes the overall direction of the junction from its equilibrium vector state. For example, conductive line 24 as depicted in FIG. 1 may be adapted to induce a magnetic field that exclusively changes the overall direction of a plurality of magnetic vectors arranged in an equilibrium state within magnetic cell junctions 26a. In some embodiments, and as shown in FIG. 1, conductive line 24 may be further adapted to induce a different magnetic field that exclusively changes the overall direction of a plurality of magnetic vectors arranged in an equilibrium state within magnetic cell junctions 26b.

In some embodiments, however, memory array 20 may include additional conductive lines with which to write to and read from magnetic cell junctions 26a and 26b. Such additional conductive lines may be adapted to conduct current along one or more directions relative and adjacent to magnetic cell junctions 26a and 26b. Consequently, conductive line 24 may not be referred to as a data line, in such an embodiment. Rather, conductive line may be referred to as a digit line or a bit line, depending on whether it is used solely for write operations or both read and write operations of the array. In such an embodiment, the write selectivity of the array may be greater than conventional arrays since the current along conductive line 24 may be conducted adjacent to less than all of the memory cells arranged along one dimension of the array.

In some embodiments, however, memory array 20 may not include current source lines 22a and 22b. In contrast, conductive line 24 may include additional portions extending from the portions of the line traversing adjacent to magnetic cell junctions 26a and/or 26b. For example, the portions of conductive line 24 aligned with the shortened dimension of magnetic cell junctions 26a and 26b may be extended along the entirety of the columns comprising the cell junctions. In this manner, memory array may still include a single field-inducing line adapted to change the magnetic directions of magnetic cell junctions 26a and/or 26b. However, such an embodiment may not eliminate the issue of write selectivity within the array. In particular, the extension of conductive line 24 aligned along a column of memory array 20 may induce a magnetic field with which to switch the magnetic direction of disturbed junctions along such a dimension. However, such an embodiment may still reduce or eliminate the number of disturbed magnetic junctions along a row of the array. Consequently, such an embodiment may have a higher write selectivity than a conventional array.

Figure 3:
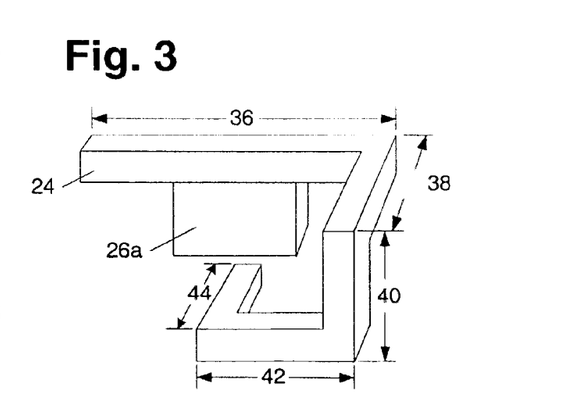
FIG. 3 depicts a partial cross-sectional view of a magnetic memory cell included in the electrical schematic diagram of FIG. 1.

FIG. 3 illustrates an exemplary three-dimensional view of conductive line 24 arranged about magnetic cell junction 26a. Such a view does not, however, show any auxiliary components of the memory array 20. In particular, FIG. 3 does not illustrate the configuration of conductive lines 22a, 22b, 30, 31a, 31b, or 32. In addition, FIG. 3 does not illustrate transistors 28, 34a or 34b. Such an exclusive set of components is merely to simplify the illustration of the configuration of conductive line 24 relative to magnetic cell junction 26a. Consequently, the drawing of FIG. 3 is not intended to illustrate a complete three-dimensional view of a memory cell.

As shown in FIG. 3, conductive line 24 may include portion 36 arranged above magnetic cell junction 26a and portion 44 arranged below magnetic cell junction 26a. In this manner, conductive line 24 may be configured to simultaneously conduct current along at least two distinct directions relative and adjacent to magnetic cell junctions 26a and 26b. In some embodiments, portion 36 may be arranged upon and in contact with an upper surface of magnetic cell junction 26a. Conversely, portion 44, in such an embodiment, may be spaced away from magnetic cell junction 26a. In yet other embodiments, portion 36 may be spaced away from magnetic cell junction 26a, while portion 44 may be arranged in contact with a lower surface of magnetic cell junction 26a. In either case, the total magnetic field induced by conductive line 24 may be adapted to switch the magnetic direction of magnetic cell junction 26a. In a preferred embodiment, the portion of conductive line 24 arranged in contact with magnetic cell junction 26a may be arranged along the shortened dimension of magnetic cell junction 26a and the portion of the data line spaced away from magnetic cell junction 26a may be arranged along the elongated dimension of magnetic cell junction 26.

In addition to portions 36 and 44, conductive line 24 may include portions 38, 40, and 42 extending between and connecting portions 36 and 44 to each other. In this manner, conductive line 24 may be a contiguous conductive line. As shown in FIG. 3, portion 38 may extend outward from portion 36 along approximately the same elevation as portion 36. In general, the length of portion 38 may be sufficient to extend beyond a lateral surface of magnetic cell junction 26a such that portion 44 may extend along the entire shortened dimension of magnetic cell junction 26a. In addition, conductive line 24 may include portion 40 extending below the end of portion 38 which is opposite from the end coupled to portion 36. The length of conductive line 24 may be such that the end of portion 40 which is opposite from the end coupled to portion 38 may be level with portion 44. In other words, portion 40 may have a length that is approximately equal to the distance between portion 36 and portion 44. Portion 42 may then be adapted to connect portions 44 and 48 along the horizontal plane of portion 44.

In general, the lateral surface area of a memory cell may include the size of the magnetic cell junctions, electrodes, underlying transistors, and any contact structures used to electrically connect the components. In addition, the lateral surface area of a memory cell may further include small portions of the bit and digit lines used at the intersection of the magnetic cell junctions. Consequently, in some embodiments, it may be advantageous to limit the amount portions 36–44 extend beyond the boundaries of magnetic cell junction 26a. In other embodiments, however, it may be advantageous to extend portions 38, 40, and 42 farther away from magnetic cell junction 26a such that portions 36 and 44 may have a higher influence on the induced magnetic field from conductive line 24. Consequently, in some embodiments, the dimensions of portions 36–44 may be optimized such that the magnetic field induced from conductive line 24 is oriented toward magnetic cell junction 26a in a manner with which the magnetic direction of magnetic cell junction 26a may be switched with a relatively small magnetic field and the amount of space occupied by each memory cell is minimized.

The fabrication of conductive line 24 may include pattern techniques known in the semiconductor fabrication industry. In particular, the method for fabricating conductive line 24 may include photolithography, depositing, and etching techniques for which portions of conductive line 24 arranged within a horizontal plane may be formed together. For example, in the embodiment of FIG. 3, portions 42 and 44 may be formed by depositing and etching a material to form the patterned portions. In addition, portion 40 may be formed by depositing a dielectric layer upon portions 42 and 44 and etching trench such that a region of portion 42 may be exposed. Subsequently, the trench may be filled and planarized to form portion 40. In particular, portion 40 may be formed by dual damascene techniques, for example. The fabrication of conductive line 24 may finish by depositing and patterning a material with a horizontal plane to form portions 36 and 38 in contact with portion 40.

Configurations of conductive line 24 other than the one shown in FIG. 3 may be alternatively arranged about magnetic cell junction 26a, in some embodiments. In particular, one or more portions of conductive line 24 may be arranged along different planes relative to the horizontal and vertical planes in which they are oriented in FIG. 3. For example, portion 38 may extend below portion 36 to a level commensurate with portion 44. In such an embodiment, portion 40 may extend laterally toward and within the same horizontal plane as portion 42. In yet another embodiment, portion 38 may extend outward in a similar manner as depicted in FIG. 3. However, portion 40 may alternatively extend with the same horizontal plane as portions 36 and 38. In this manner, portion 42 may be formed in a vertical manner to extend down to portion 44. In yet other embodiments, conductive line 24 may include additional portions with which to connect portions 36 and 44. Such additional portions may be used to extend conductive line 24 beyond the boundaries outlined in FIG. 3. For example, one or more additional portions may be used to bring a portion of conductive line 24 farther or closer to magnetic cell junction 26a. Furthermore, it is noted that the configuration of conductive line 24 about magnetic cell junction 26a may be similarly applied to magnetic cell junction 26b.

Figure 4:
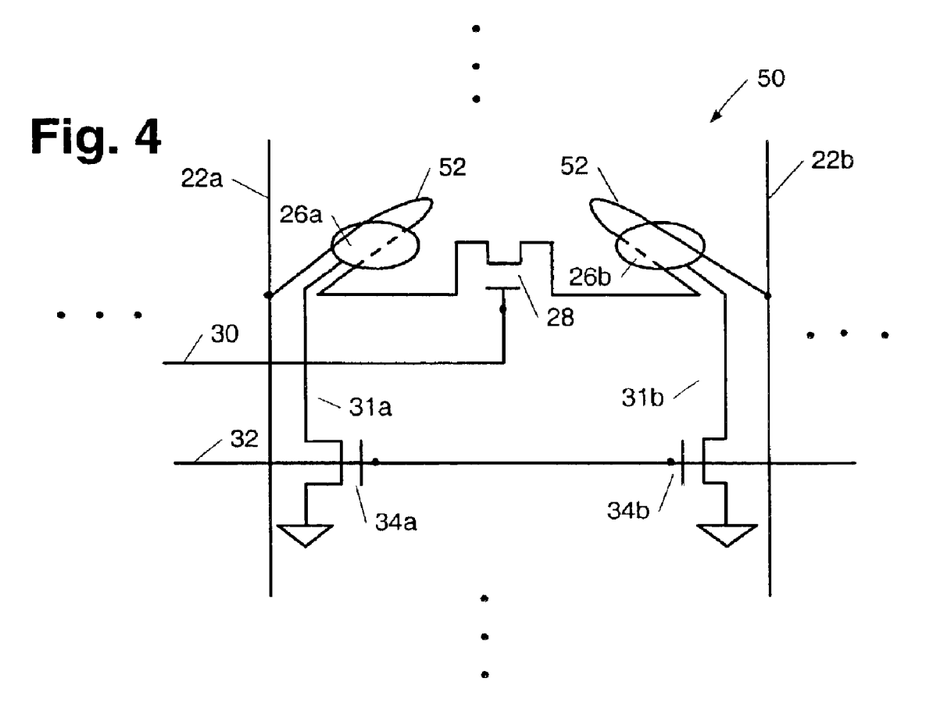
FIG. 4 depicts a partial electrical schematic diagram of a magnetic memory cell array in an alternative embodiment.

An alternative exemplary embodiment of a magnetic memory array as described herein is illustrated in FIG. 4. In particular, FIG. 4 illustrates magnetic memory array 50 including conductive line 52 arranged about magnetic cell junctions 26a and 26b. Similar to magnetic memory array 20 described in reference to FIG. 2, magnetic memory array 50 may include current source lines 22a and 22b, select line 30, interconnect lines 31a and 31b, word line 32, and transistors 28, 34a, and 34b. Such lines and transistors may be adapted for similar functions as their respective lines and transistors used in FIG. 2 for magnetic memory array 20. In addition, conductive line 52 may have portions arranged above each of magnetic cell junctions 26a and 26b and other portions arranged below each of magnetic cell junctions 26a and 26b. In this manner, conductive line 52 may be configured to conduct current along two distinct directions relative and adjacent to magnetic cell junctions 26a and 26b.

However, as shown in FIG. 4, the configuration of conductive line 52 about magnetic cell junctions 26a and 26b may be substantially different than the configuration of conductive line 24 within magnetic memory array 20 of FIG. 1. In particular, conductive line 52 may be configured such that at least a portion of conductive line 52 is aligned at an angle between approximately 0 degrees and approximately 90 degrees relative to the easy axis of the magnetic cell junction. In this manner, conductive line 52 may be configured such that at least a portion of conductive line 52 is aligned at an angle between approximately 0 degrees and approximately 90 degrees relative to the elongated dimension of the magnetic cell junction in some embodiments. In some cases, conductive line 52 may be aligned at an angle between approximately 30 degrees and approximately 60 degrees, or more specifically 45 degrees, relative to the easy axis of magnetic cell junctions 26a and 26b.

In some embodiments, the portions of conductive line 52 arranged above and below each of magnetic cell junctions 26a and 26b may be substantially parallel to one another. In other words, the portions of conductive line 52 arranged above and below each of magnetic cell junctions 26a and 26b may be arranged at substantially similar angles relative to the easy axes of the magnetic cell junctions. In this manner, conductive line 52 may be adapted to conduct current in substantially opposite directions. Such a case may be particularly advantageous for maximizing the magnetic field generated about magnetic cell junctions 26a and 26b. In particular, the magnetic fields induced by the portions of conductive line 52 arranged above and below the magnetic cell junctions may combine to generate a total magnetic field amplitude that is greater than what may be obtained in embodiments in which such portions are not arranged parallel to each other. In fact, such a total magnetic field may be greater than approximately 1.4 times (i.e., approximately the square root of 2) the magnetic field generated from conductive line 24 in memory array 20 in FIG. 1. Consequently, the configuration of conductive line 52, in such an embodiment, may advantageously minimize the amount of current needed operate memory array 50, reducing the overall power requirements of the array.

In yet other embodiments, the portions of conductive line 52 arranged above and below each of magnetic cell junctions 26a and 26b may not be substantially parallel to one another. In such a case, conductive line 52 may be adapted to conduct current in two distinct directions relative to and adjacent to magnetic cell junctions 26a and 26b, but not necessarily in opposite directions from each other. In any case, the portions of conductive line 52 arranged above and below magnetic cell junctions 26a and 26b may be connected by a supplementary portion arranged laterally adjacent to magnetic cell junctions 26a and 26b, thereby making a contiguous conductive line about magnetic the cell junctions.

It is noted that memory array 50 may include any of the configurations described for memory array 20 in reference to FIG. 1. For example, conductive line 52 may be adapted to conduct current adjacent to only one of magnetic cell junctions 26a and 26b, in some embodiments. In other cases, conductive line 52 may be adapted to conduct current adjacent to more than one magnetic cell junction along a row or column of array 50. In a preferred embodiment, conductive line 52 may be configured to conduct current adjacent to less than all of the magnetic junctions arranged along a row or column of array 50. In addition or alternatively, conductive line 52 may be configured about magnetic cell junctions 26a and 26b in substantially the same manner, such that magnetic fields having the same direction may be induced about the junctions. In yet other embodiments, conductive line 52 may be configured about magnetic junctions is opposite manners, such that bits of opposite values may be written to the junctions. In addition, array 50 may, in some embodiments, include a transistor for each magnetic cell junction of the array. In particular, array 50 may include a plurality of transistors each adapted control current flow through a field-inducing line arranged adjacent to a magnetic cell junction during a write operation of the device. Furthermore, array 50 may be absent of source lines 22a and 22b. Moreover, array 50 may include one or more conductive lines which are adapted to contribute to the magnetic fields generated about magnetic junctions 26a and 26b.

The fabrication of such a contiguous conductive line may be similar to the fabrication of conductive line 24 described in reference to FIG. 3. In particular, the bottom, side, and top portions of conductive line 52 may be fabricated using photolithography, etching, and/or planarization techniques known in the semiconductor fabrication industry. In addition, the method of operation of memory array 50 may be similar to the method of operation described in reference to FIG. 2. More specifically, the write operation of memory array 50 may include applying a voltage to the gate of transistor 28 such that current may flow through conductive line 52, inducing a magnetic field by which to switch the magnetic directions of magnetic cell junctions 26a and 26b. In addition, the read operation of memory array 50 may include applying a voltage to the gates of transistors 34a and/or 34b such that current may flow through magnetic cell junctions 26a and 26b from conductive line 52.

It will be appreciated to those skilled in the art having the benefit of this disclosure that this invention is believed to provide a field-inducing line configuration within a memory cell and a method for writing to such a memory cell. Further modifications and alternative embodiments of various aspects of the invention will be apparent to those skilled in the art in view of this description. For example, the dimensions, angles, and configurations of the field-inducing lines described herein are not limited to the configurations provided in FIGS. 1, 3, and 4. More specifically, any field-inducing line adapted to simultaneously conduct current along at least two distinct directions relative and adjacent to a magnetic cell junction may be incorporated into the description included herein. It is intended that the following claims be interpreted to embrace all such modifications and changes and, accordingly, the specification and drawings are to be regarded in an illustrative rather than a restrictive sense.

What is claimed is:

1. A memory array comprising a conductive line adapted to simultaneously conduct current in at least two distinct directions relative and adjacent to a magnetic junction of the memory array.

2. The memory array of claim 1, wherein one of the distinct directions is substantially aligned with an easy axis of the magnetic junction, and wherein another of the distinct directions is substantially aligned with a hard axis of the magnetic junction.

3. The memory array of claim 1, wherein at least one of the distinct directions is aligned at an angle between approximately 0 degrees and approximately 90 degrees relative to an easy axis of the magnetic junction.

4. The memory array of claim 3, wherein at least two of the distinct directions are aligned in substantially opposite directions from each other.

5. The memory array of claim 1, wherein the conductive line comprises a data line of the memory array.

6. The memory array of claim 1, substantially absent of another conductive line adapted to induce a magnetic field about the magnetic junction.

7. The memory array of claim 1, further comprising a transistor adapted to control current flow through the conductive line during a write operation of the memory array.

8. The memory array of claim 7, further comprising another transistor adapted to control current flow from the conductive line through the magnetic junction during a read operation of the memory array.

9. A memory array comprising a contiguous conductive line having a first portion arranged above and adjacent to a magnetic junction of the memory array and a second portion arranged below and adjacent to the magnetic junction.

10. The memory array of claim 9, wherein one of the first and second portions is aligned with an easy axis of the magnetic junction and the other of the first and second portions is aligned with a hard axis of the magnetic junction.

11. The memory array of claim 10, wherein one of the first and second portions is aligned with an elongated dimension of the magnetic junction and the other of the first and second portions is aligned with a shortened dimension of the magnetic junction.

12. The memory array of claim 9, wherein at least one of the first and second portions is aligned at an angle between approximately 0 degrees and approximately 90 degrees relative to an easy axis of the magnetic junction.

13. The memory array of claim 12, wherein the first and the second portions am aligned substantially parallel to one another.

14. The memory array of claim 10, wherein the magnetic junction is one of an array of magnetic junctions, and wherein the memory array is adapted to selectively enable current to flow from a single source line to the conductive line and one or more additional conductive lines arranged within the array.

15. The memory array of claim 10, wherein the conductive line is configured to induce a first magnetic field that exclusively changes the overall direction of a plurality of magnetic vectors arranged in an equilibrium state within the magnetic junction.

16. The memory array of claim 15, wherein the conductive line is further configured to induce a second magnetic field that exclusively changes the overall direction of a plurality of magnetic vectors arranged in an equilibrium in state within another magnetic junction of the memory array.

17. The memory array of claim 16, wherein the magnetic junction and the other magnetic junction comprise a differential pair of magnetic junctions.

18. A magnetic random access memory array comprising:
first and second magnetic coil junctions;
first and second conductive lines respectively arranged adjacent to the first and second magnetic coil junctions; and
a transistor electrically coupled between the first end second conductive lines such that current flows from one of the first and second conductive lines to the other of the first and second conductive lines upon an application of voltage to the transistor.

19. The magnetic random access memory array of claim 18, wherein at least one of the first and second conductive lines is configured to simultaneously conduct current in at least two distinct directions relative and adjacent to a magnetic junction of the memory array.

20. The magnetic random access memory array of claim 18, wherein the first conductive line comprises:
a first portion arranged above and adjacent to the first magnetic junction; and
a second portion arranged below and adjacent to the first magnetic junction.

* * * * *

UNITED STATES PATENT AND TRADEMARK OFFICE
CERTIFICATE OF CORRECTION

PATENT NO. : 6,862,215 B1  Page 1 of 1
DATED : March 1, 2005
INVENTOR(S) : Pancholy et al.

It is certified that error appears in the above-identified patent and that said Letters Patent is hereby corrected as shown below:

Title page,
Item [74], *Attorney, Agent, or Firm*, delete "Mollie E. Lortang" and substitute
-- Mollie E. Lettang --.

Column 17,
Line 23, delete "am" and substitute -- are --.

Column 18,
Line 6, after "equilibrium," delete "in.".
Line 16, delete "end" and substitute -- and --.

Signed and Sealed this

Seventh Day of March, 2006

JON W. DUDAS
*Director of the United States Patent and Trademark Office*